(12) United States Patent
Soo Kwon et al.

(10) Patent No.: US 7,910,491 B2
(45) Date of Patent: Mar. 22, 2011

(54) GAPFILL IMPROVEMENT WITH LOW ETCH RATE DIELECTRIC LINERS

(75) Inventors: Young Soo Kwon, Hwasung (KR); Bi Jang, Yongin (KR); Anchuan Wang, San Jose, CA (US); Young S. Lee, San Jose, CA (US); Mihaela Balseanu, Sunnyvale, CA (US); Li-Qun Xia, Cupertino, CA (US); Jin Ho Jeon, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 82 days.

(21) Appl. No.: 12/437,256

(22) Filed: May 7, 2009

(65) Prior Publication Data

US 2010/0099236 A1   Apr. 22, 2010

Related U.S. Application Data

(60) Provisional application No. 61/106,076, filed on Oct. 16, 2008.

(51) Int. Cl.
   *H01L 21/302*   (2006.01)
(52) U.S. Cl. .......... 438/738; 257/E21.546; 257/E21.396
(58) Field of Classification Search .............. 438/9, 435, 438/443, 761, 705, 706, 738; 257/E21.546, 257/E21.24, E21.396
   See application file for complete search history.

(56) References Cited

U.S. PATENT DOCUMENTS

| | | | |
|---|---|---|---|
| 3,451,840 A | 6/1969 | Hough | |
| 4,571,819 A * | 2/1986 | Rogers et al. | 438/430 |
| 4,656,052 A | 4/1987 | Satou et al. | |
| 5,270,125 A | 12/1993 | America et al. | |
| 5,306,530 A | 4/1994 | Strongin et al. | |
| 5,316,804 A * | 5/1994 | Tomikawa et al. | 427/569 |
| 5,483,920 A | 1/1996 | Pryor | |
| 5,534,070 A | 7/1996 | Okamura et al. | |
| 5,536,360 A | 7/1996 | Nguyen et al. | |
| 5,626,922 A | 5/1997 | Miyanaga et al. | |
| 5,897,751 A | 4/1999 | Makowiecki | |
| 6,531,377 B2 | 3/2003 | Knorr et al. | |
| 6,759,261 B2 | 7/2004 | Shimokohbe et al. | |
| 6,958,175 B2 | 10/2005 | Sakamoto et al. | |
| 7,081,414 B2 * | 7/2006 | Zhang et al. | 438/710 |
| 7,205,240 B2 | 4/2007 | Karim et al. | |
| 2002/0197823 A1 | 12/2002 | Yoo et al. | |
| 2003/0224217 A1 | 12/2003 | Byun et al. | |
| 2004/0245091 A1 * | 12/2004 | Karim et al. | 204/192.12 |
| 2005/0048801 A1 | 3/2005 | Karim et al. | |

(Continued)

OTHER PUBLICATIONS

Iijma et al., "Highly Selective SiO2 Etch . . . ", 1997, Jpn. J. Appl. Phys., vol. 26, Part I, No. 9A, pp. 5498-5501.*

(Continued)

*Primary Examiner* — Thomas L Dickey
*Assistant Examiner* — Nikolay Yushin
(74) *Attorney, Agent, or Firm* — Townsend and Townsend and Crew (57) ABSTRACT

A method of filling a trench is described and includes depositing a dielectric liner with a high ratio of silicon oxide to dielectric liner etch rate in fluorine-containing etch chemistries. Silicon oxide is deposited within the trench and etched to reopen or widen a gap near the top of the trench. The dielectric liner protects the underlying substrate during the etch process so the gap can be made wider. Silicon oxide is deposited within the trench again to substantially fill the trench.

24 Claims, 8 Drawing Sheets

U.S. PATENT DOCUMENTS

2006/0019486 A1 1/2006 Yu et al.
2006/0207504 A1 9/2006 Hasebe et al.
2007/0197028 A1 8/2007 Byun et al.
2008/0292798 A1 11/2008 Huh et al.
2010/0098884 A1 4/2010 Balseanu et al.

OTHER PUBLICATIONS

PCT International Search Report and Written Opinion mailed Apr. 30, 2010, International Application No. PCT/US2009/058832, 13 pages.

* cited by examiner

GAPFILL IMPROVEMENT WITH LOW ETCH RATE DIELECTRIC LINERS

CROSS-REFERENCES TO RELATED APPLICATIONS

This application claims the benefit of U.S. Provisional Application No. 61/106,076 by Kwon et al, filed Oct. 16, 2008 and titled "GAPFILL IMPROVEMENT WITH HIGH LOW ETCH RATE DIELECTRIC LINERS". This application is related to U.S. patent application Ser. No. 11/765,257 and U.S. Pat. Prov. App. Ser. No. 61/042,638, both titled "BORON NITRIDE AND BORON NITRIDE-DERIVED MATERIALS DEPOSITION METHOD." The entire contents of all three applications are herein incorporated by reference for all purposes.

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND

Increasing the density of integrated circuits can increase speed and enable new applications. The increased density can increase undesirable electrical interactions between adjacent circuit elements and conducting lines. Unwanted interactions are typically prevented by providing trenches that are filled with electrically insulating material to isolate the elements both physically and electrically. As circuit densities increase, however, the widths of these trenches decrease, increasing their aspect ratios and making it progressively more difficult to fill the trenches without leaving voids. A trench which is not completely filled is undesirable since the degree of isolation may be compromised, thus limiting the maximum operational frequency or otherwise adversely affecting operation of the integrated circuit.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that ionized reactants form a greater percentage of the total reactant population. While each of these techniques falls broadly under the umbrella of "CVD techniques," each of them has characteristic properties that make them more or less suitable for certain specific applications.

In some instances where trenches have a large aspect ratio and narrow width, trenches have been filled with each of these CVD techniques using a "dep/etch/dep" process involving sequentially depositing material, etching some of it back, and depositing additional material. The etching step acts to reshape the partially filled trench, opening it so that more material can be deposited before it closes up and leaves an interior void. The etching step can penetrate through deposited material and damage underlying layers especially near the tops of trenches or vias. In the case of shallow trench isolation (STI) the underlying semiconductor and/or protective silicon nitride barrier layer may be damaged which can cause device instability. Device reliability is generally at risk when the etching step is allowed to remove too much material.

BRIEF SUMMARY

A method of filling a trench is described and includes depositing a dielectric liner with a high ratio of silicon oxide to dielectric liner etch rate in fluorine-containing etch chemistries. Silicon oxide is deposited within the trench and etched to reopen or widen a gap near the top of the trench. The dielectric liner protects the underlying substrate during the etch process so the gap can be made wider. Silicon oxide is deposited within the trench again to substantially fill the trench.

In one embodiment, a method of depositing dielectric material in a trench in a semiconductor substrate includes forming a liner layer containing boron nitride over bottom and sidewall surfaces of the trench and depositing the dielectric material containing silicon oxide over the liner layer such that the dielectric material at least partially fills the trench. The method further includes etching a portion of the deposited dielectric material with an etchant, removing the dielectric material at a higher etch rate than the liner layer.

In another embodiment, a method of removing a void formed in a dielectric material that fills a trench in a semiconductor substrate includes etching a top portion of the dielectric material to expose an opening in the void, in which the etching also exposes a portion of a liner layer comprising boron nitride that was covered by the dielectric material. The method further includes depositing additional dielectric material into the exposed void to remove the void by filling it with the additional dielectric material.

In yet another embodiment, a method of depositing a film to fill a gap in a surface of a substrate includes forming a dielectric liner on the surface of the substrate, in which a silicon oxide to dielectric liner etch ratio is greater than about 50. The method further includes depositing a first layer of dielectric on the dielectric liner, etching the surface of the substrate and depositing a second layer of dielectric to substantially fill the gap.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of filling a trench is described and includes depositing a dielectric liner with a high ratio of silicon oxide to dielectric liner etch rate in fluorine-containing etch chemistries. Silicon oxide is deposited within the trench and etched to reopen or widen a gap near the top of the trench. The dielectric liner protects the underlying substrate during the etch process so the gap can be made wider. Silicon oxide is deposited within the trench again to fill the trench.

Embodiments of the invention are directed to methods of depositing a film to fill a trench in a surface of a substrate. For trenches of a given width, embodiments use a multistep deposition and etching process in which the etching process occurs between deposition processes to widen or reopen a gap within the film. A dielectric liner layer having a low HF etch rate relative to silicon oxide is deposited conformally on a trench in the surface of the substrate and followed by a silicon oxide dep/etch/dep sequence which represents the order of the silicon oxide processing steps in the sequence. The improved protection of surface features provided by the dielectric liner layer enables even higher aspect ratio trenches to be filled without voids before damage is done to the walls of the trench which can ultimately impact device operation. In particular, the embodiments of the invention may be used for filling trenches below or about 45 nm wide and are suitable for a variety of different gapfill applications, e.g. shallow-trench-isolation.

Figure 1:
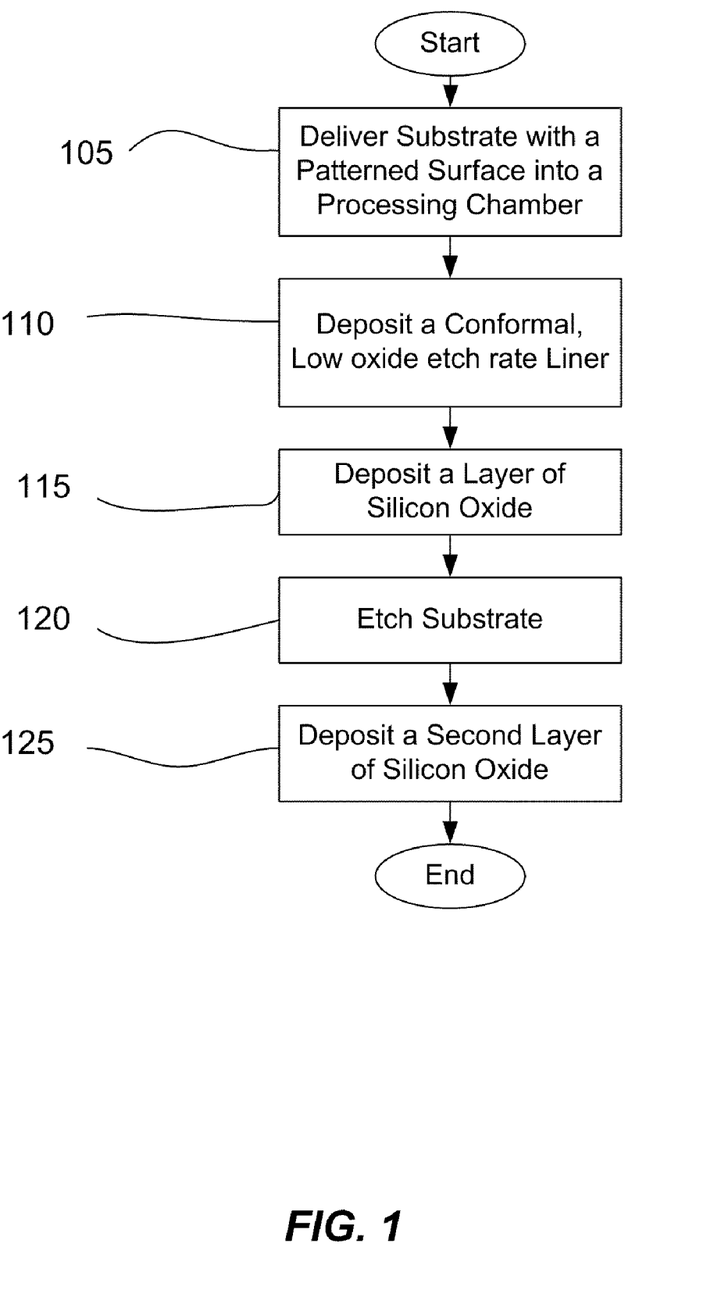
FIG. 1 is a flow chart of a silicon oxide gapfill deposition process according to disclosed embodiments.

In order to better understand and appreciate the invention, reference is now made to FIG. 1 and FIG. 2 which are a flow chart of a silicon oxide gapfill deposition process and cross-sectional views according to disclosed embodiments. The process begins when a substrate 200 with a trench 210 on the surface is transferred into a processing chamber (Step 105 and FIG. 2A). The trench may be created by the presence of two walls of homogeneous material or, as shown, may be formed from walls of different materials 205, 206. In some cases the walls are formed in the support substrate material itself. A thin conformal liner layer of a material, such as boron nitride, with a relatively low etch rate is deposited on the substrate (Step 110 resulting in FIG. 2B). The thin conformal liner 250 is thin compared to the width of the trench 210. A material with a relatively low etch rate, as used herein, describes a material which etches more slowly than common silicon nitride in a fluorine-based etch process.

Figure 2A:
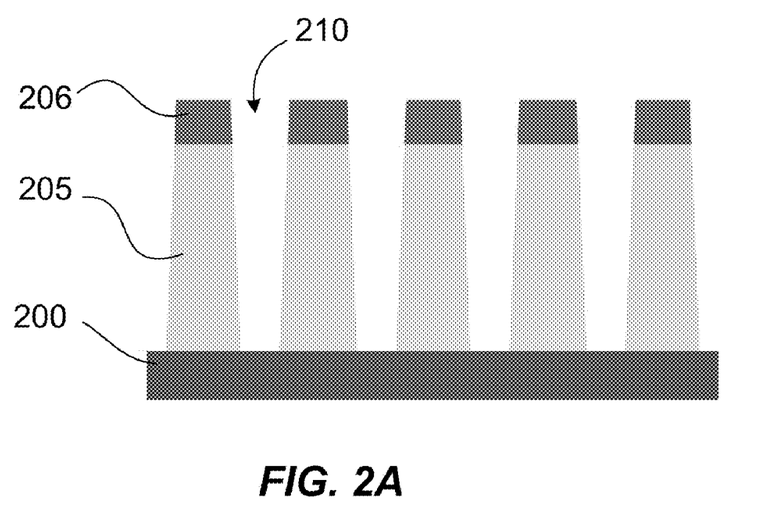
FIG. 2A-E are cross-sectional views of features on a substrate during a deposition process according to disclosed embodiments.
Figure 2B:
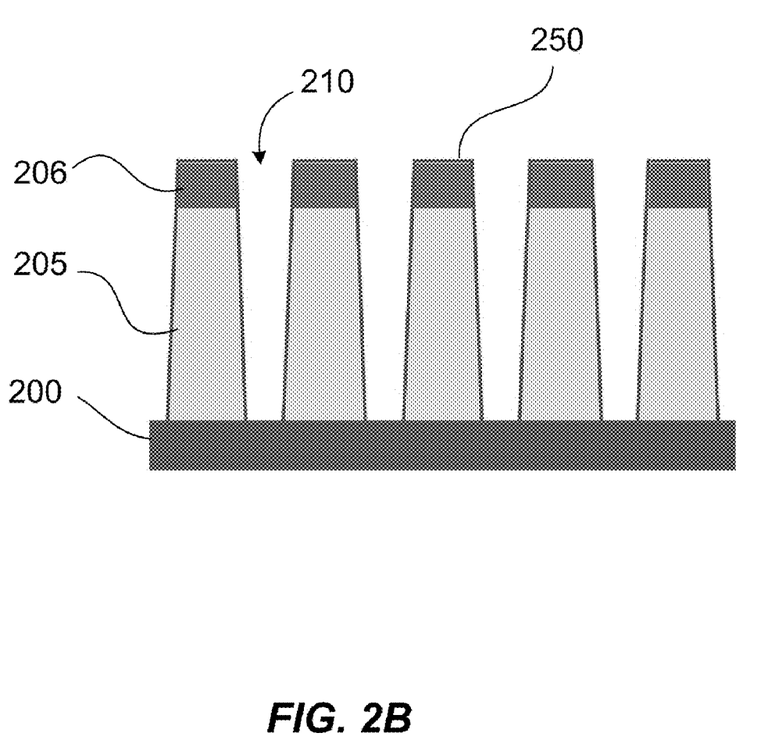
Figure 2C:
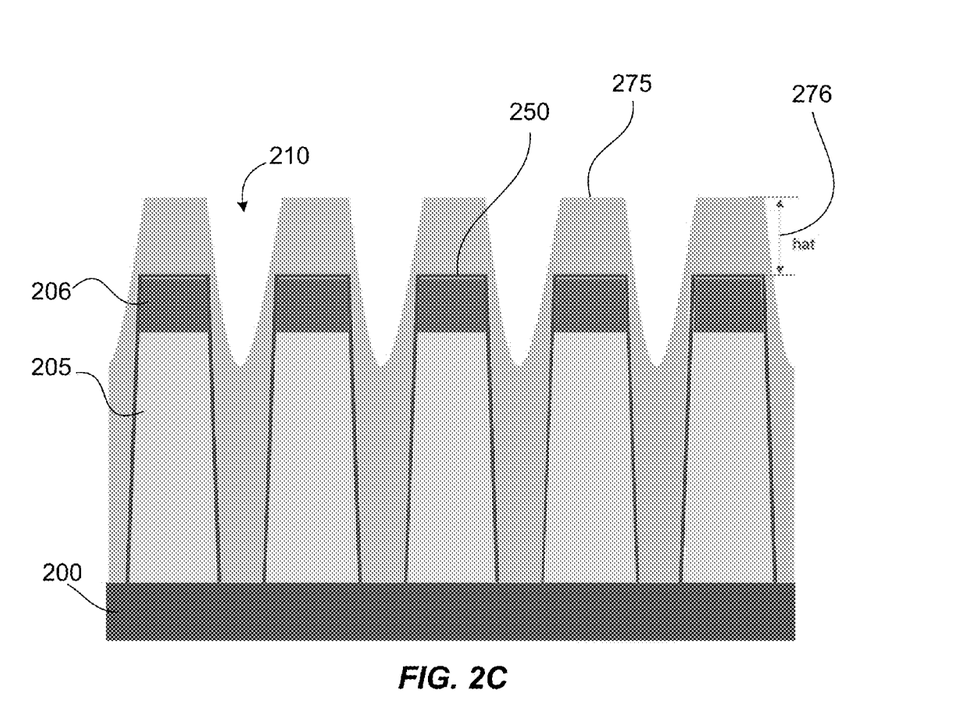

Following the deposition of the liner 250, the process of filling the trench 210 begins with depositing a layer of silicon oxide (Step 115 resulting in FIG. 2C). The layer of silicon oxide 275 fills a portion of the trench 210. The thickness of the layer of silicon oxide 275 may grow more quickly near the top of the trench 210 than the sides or the bottom. This can result in a narrowed gap above the trench 210 or even a closed void (not shown) in the trench 210. A closed void which is left in the trench and incorporated into a completed device or integrated circuit may compromise device performance or affect yield.

Figure 2D:
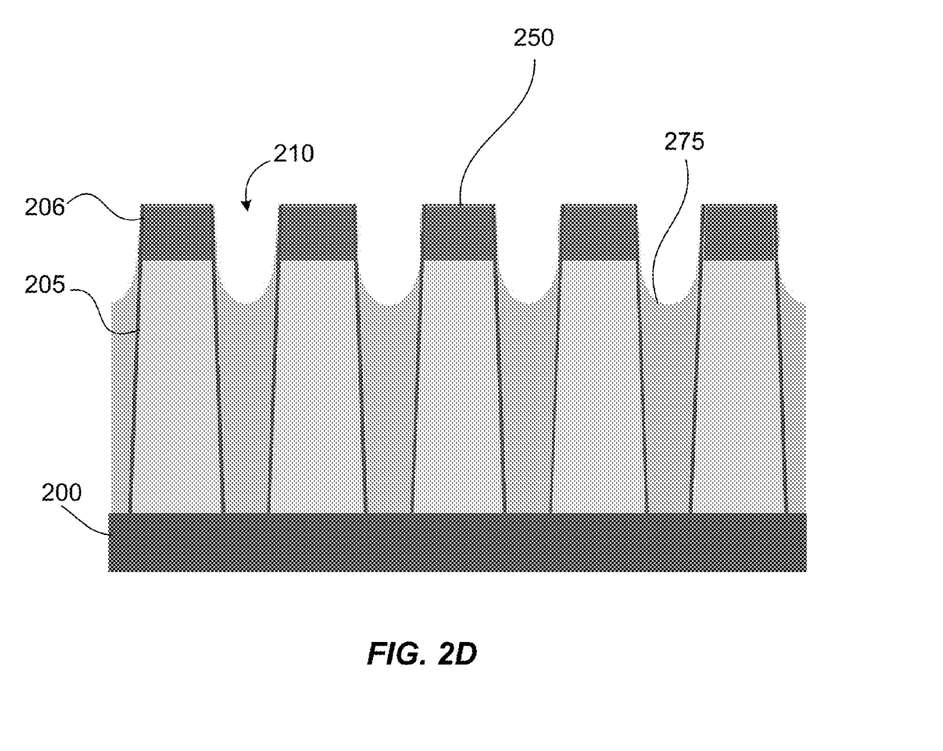
Figure 2E:
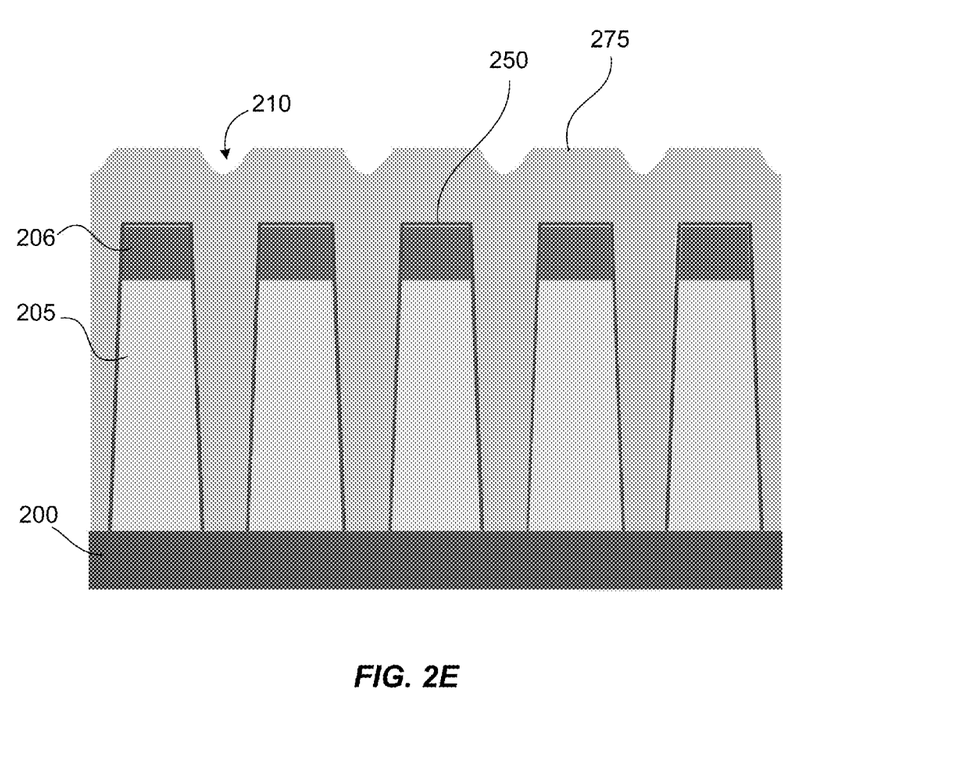

The deposition process is stopped and the substrate is etched back (Step 120 resulting in FIG. 2D) in order to reduce the formation of voids in the trench 210 during a subsequent deposition of material. In embodiments, the liner is boron nitride which exhibits a lower etch rate than silicon nitride for a same or similar fluorine-based etch process. Silicon nitride is a common alternative liner material. The lower etch rate of liners according to disclosed embodiments may allow the etch process to continue longer so the trench 210 is more accessible. Alternatively or in combination, the lower etch rate of a liner allows the etch process to be made more aggressive at removing both liner and silicon oxide. Such a modification may result from a change in etch plasma parameters, a change in fluorine chemistry or other etch process parameters known to those of skill in the art. A longer and/or more aggressive etch may remove relatively more silicon oxide without damaging the liner or top sidewall material 205, 206 to the point where performance of a device is compromised. The etch process may involve fluorine-containing gases with or without a plasma. The etch may remove more material from high points of the silicon oxide layer 275 and less from the bottom of the trench 210 to improve the gapfill of the next step. A second deposition of silicon oxide onto the etched substrate then fills the trench 210 between the two sidewalls (Step 125 resulting in FIG. 2E).

Though the exemplary process represented by FIGS. 1 and 2 shows a process involving two depositions surrounding one etch (referred to succinctly as a "dep/etch/dep"), the process may involve any number of etch processes with a deposition preceding and following each etch (e.g. a dep/etch/dep/etch/dep). A neighboring pair of deposition and etch processes may not border one another. In practice, there may be a gap between the pair of processes and, in some cases, the wafer may be removed from one processing chamber and transferred to another between the two processes.

Figure 3A:
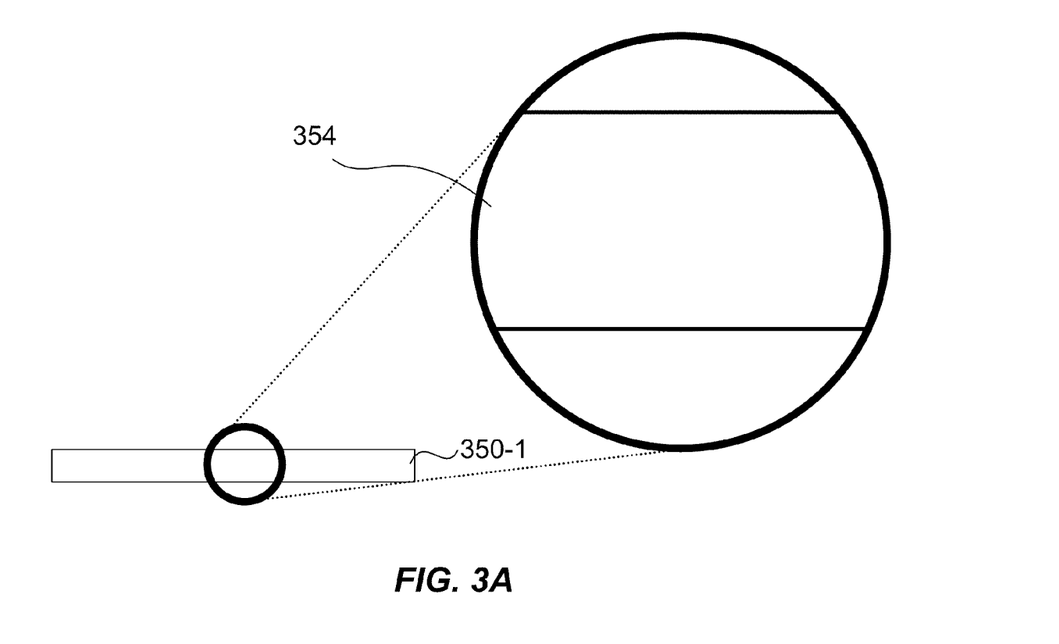
FIG. 3A-B are cross-sectional views of a barrier layer according to disclosed embodiments.

A single layer liner 350-1 of relatively low etch rate material, such as boron nitride, is shown in FIG. 3A in cross-section. A magnified cross-sectional view of the liner is also shown indicating one layer of material 354. The chemical composition of the single layer liner is different from a typical liner material and the associated etch rate is lower. When introduced into a process flow there is some chance that material (e.g. boron) may leach out of the single layer liner and detrimentally affect device performance or the process flow. Silicon nitride is known to be a capable barrier to diffusion of material either leaching into or out of the underlying portion of the substrate. Liners according to disclosed embodiments may provide similar utility as a barrier layer in many applications. In other applications which might be sensitive to boron diffusion, one or more silicon nitride liners may be integrated into the process flow of FIG. 1 in order to avoid or suppress the diffusion of material from these new liners into the region above or below the liner.

Figure 3B:
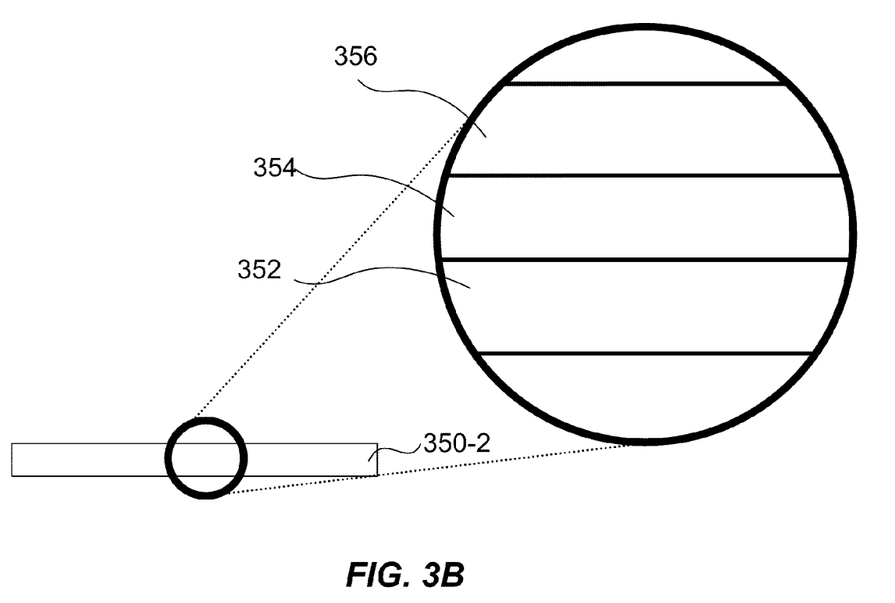

In order to reduce diffusion into the region below the liner, a layer of silicon nitride may be deposited between Step 105 and Step 110. A step of depositing a layer of silicon nitride may also be inserted between Step 110 and Step 115 to reduce diffusion of chemicals from the new liner material into the region above the liner. These inserted layers of silicon nitride may are generally referred to herein as barrier layers or diffusion barrier layers and may be made of other materials than silicon nitride. Thus in embodiments, composite layers including bilayers and trilayers may be formed for use as liners before silicon oxide deposition. At least one of the layers in a composite layer may exhibit a relatively low etch rate relative to prior art silicon nitride layers according to embodiments of the invention. FIG. 3B is a cross-sectional view of trilayer liner 350-2. A magnified cross-sectional view of the liner is also shown indicating three layers of material including a bottom layer of silicon nitride 352, boron nitride 354 and a top layer of silicon nitride 356.

Referring now to the dep/etch/dep sequence for filling a trench, the two deposition techniques of a given sequence may be the same deposition techniques or recipes. However, they may be distinct from one another. Representative oxide deposition methods are CVD, HDP-CVD, SACVD, eHARP, HTUSG and $O_3$-TEOS. Flowable techniques such as spin-on glass (SOG) may have improved gapfill capabilities but may still benefit from process sequences according to disclosed embodiments depending on the viscosity and other SOG process parameters.

Methods according to disclosed embodiments provide utility for a wide variety of fluorine-containing dry etch and wet etch processes. The etch ratios for two representative fluorine-containing dry-etch processes are shown in Table I. The ratios of the oxide etch rate to silicon nitride etch rate using the two fluorine etch processes are shown in one column. Similarly, silicon oxide to boron nitride etch rate ratios for the two fluorine etches are shown in the last column. Since silicon oxide etches so much more quickly than boron nitride in an oxide etch, a portion of a liner made from boron nitride can remain when at least a portion of a silicon nitride liner of similar thickness would have been removed by the same oxide etch process. These two fluorine etch processes involve two precursors, $NH_3$ and $NF_3$, and "Etch 1" involves a higher $NF_3$ concentration than "Etch 2" in order to increase the etch rate of silicon oxide.

TABLE I

Etch Ratios Relative to Silicon Oxide

|  | Silicon Nitride | Boron Nitride |
| --- | --- | --- |
| Etch 1 | 19.9 | 147 |
| Etch 2 | 39.2 | 126 |

The dielectric liners disclosed may be single layers of a relatively low etch rate material or multilayers combining silicon nitride with such single layers. Dielectric liners may be less than 10 nm, less than 5 nm, less than 2 nm or less than 1 nm thick in different embodiments. These thicknesses include the thickness(es) of any barrier layer(s) included in composite liner layers. Composite liner layers are made from at least or about 25%, at least or about 50% or at least or about 75% low etch rate material in different embodiments.

In order to facilitate a comparison between silicon oxide, silicon nitride and dielectric liners according to embodiments, a reference etch is chosen to be a room temperature 1% HF aqueous solution. Silicon oxide to dielectric liner etch ratios, unless otherwise noted, will be given here with reference to this reference etch. The ratio of the silicon oxide etch rate to a silicon nitride liner etch rate may be between 1 and 50. With regard to the present invention, the ratio of silicon oxide etch rate to dielectric liner etch rate may be greater than or about 50, greater than or about 75 or greater than or about 100 in different embodiments. With regard to a composite liner layer, the ratio of etch rates is calculated using the etch rate of the relatively low etch rate layer within the composite liner layer.

Relatively low etch rate materials, according to disclosed embodiments, are not limited to boron nitride layers. Included in the disclosed embodiments are other materials which provide similar utility. Similar deposition methods may be used to form liners comprising boron and/or carbon and displaying similar silicon oxide to dielectric liner etch ratios. Liners may have an atomic concentration of boron which is greater than or about 5%, greater than or about 10% or greater than or about 20% in different embodiments. Alternatively or in combination with boron concentrations, liners may have an atomic concentration of carbon which is greater than or about 5%, greater than or about 10% or greater than or about 20% in different embodiments. Higher boron and/or carbon concentrations correlate with a lower HF etch rate. Exemplary films are boron nitride (BN), boron oxide ($B_2O_3$), silicon carbide (SiC), boron carbide (BC), carbon nitride (CN), silicon boron nitride (SiBN), boron silicon oxide ($BSi_xO_y$), phosphorus boron nitride (PBN), silicon carbon nitride (SiCN) and boron carbon silicon nitride (BCSiN) films.

An exemplary method of depositing a boron-containing liner layer will be described while referring to the flow chart of FIG. 4. The example will focus on methods of depositing boron nitride and boron oxide. As shown in step 405, a boron-containing precursor is introduced into a chamber. In step 410, a boron-containing film is deposited on a substrate in the chamber from the boron-containing precursor. Then, in step 415, the boron-containing film is treated to modify the film composition (e.g., to increase the nitrogen or oxygen content of the film). Treating the boron-containing film comprises exposing the boron-containing film to a nitrogen-containing or oxygen-containing precursor.

Returning to step 405, the chamber into which the boron-containing precursor is introduced may be any chemical vapor deposition chamber or a plasma-enhanced chemical vapor deposition chamber. Examples of chambers that may be used include the PRODUCER® SE and PRODUCER® GT PECVD chambers, both of which are available from Applied Materials, Inc. of Santa Clara, Calif. The processing conditions provided herein are provided for a 300 mm PRODUCER® SE chamber with two isolated processing regions, with one substrate per processing region. Thus, the flow rates experienced per each substrate processing region and substrate are half of the flow rates into the chamber.

The substrate on which the boron-containing film is deposited may be a silicon, silicon-containing, or glass substrate. The substrate may be a bare substrate or have one or more layers of material deposited thereon and/or features formed therein.

The boron-containing precursor may be diborane ($B_2H_6$), borazine ($B_3N_3H_6$), or an alkyl-substituted derivative of borazine. The boron-containing precursor may be introduced into the chamber at a flow rate between about 5 sccm and about 50 slm, such as between about 10 sccm and about 1 slm. Typically, the boron-containing precursor is introduced into the chamber with nitrogen ($N_2$), hydrogen ($H_2$), argon (Ar) or a combination thereof as a dilution gas. The dilution gas may be introduced into the chamber at a flow rate between about 5 sccm and about 50 slm, such as between about 1 slm and about 10 slm.

Figure 4:
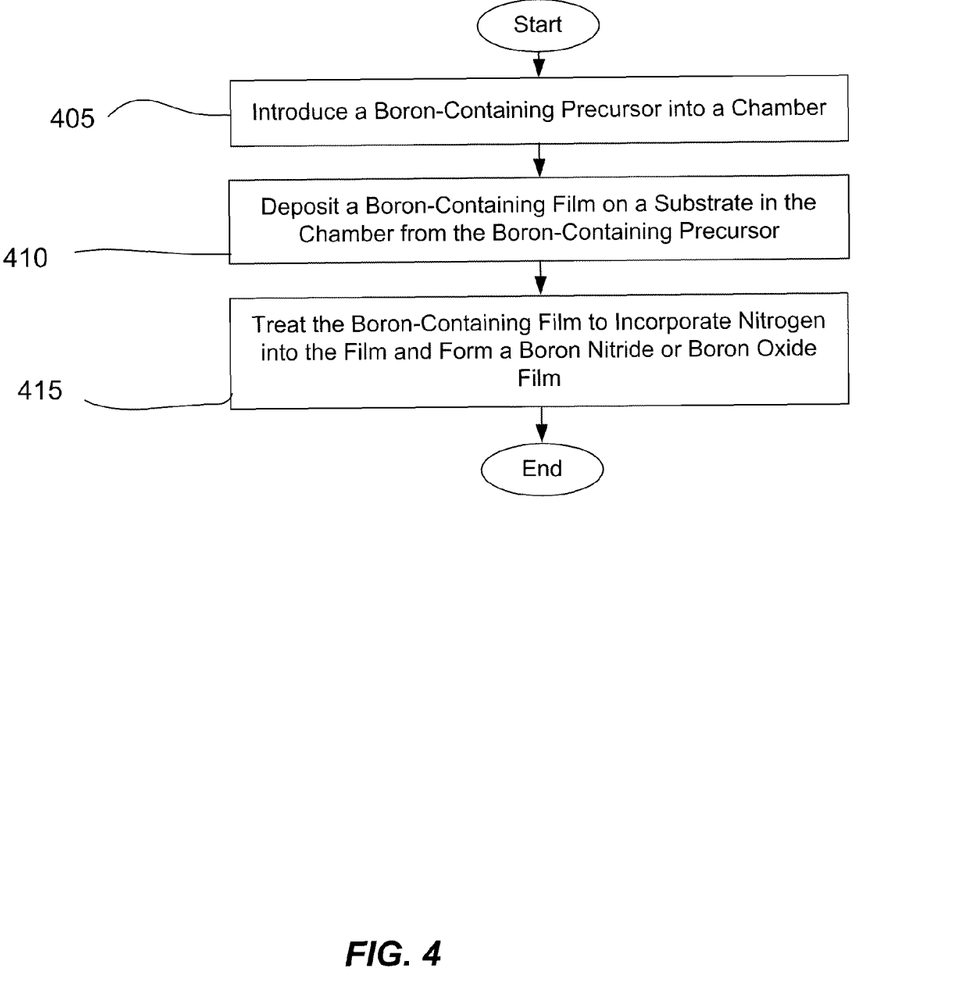
FIG. 4 is a flow chart of a method of forming boron nitride and boron oxide films.

In embodiments, a boron-containing film may be formed in Step 415 of FIG. 4 by introducing a nitrogen-containing compound and/or an oxygen-containing film. Examples of nitrogen-containing compounds that may be used include ammonia ($NH_3$), hydrazine ($N_2H_4$). Examples of oxygen-containing compounds include oxygen ($O_2$), nitric oxide (NO), nitrous oxide ($N_2O$), carbon dioxide ($CO_2$), and water ($H_2O$). Other compounds may be used as well including silicon-containing compounds, carbon-containing compounds, phosphorous-containing compounds etc. Combinations of compounds may also be used. In some instances these compounds may be present while the boron-containing precursor is in the chamber (not shown in FIG. 4). Alternatively, the compound may be introduced into the chamber before or after the introduction of the boron-containing precursor. Examples of silcon-containing compounds that may be used include silane, trisilylamine (TSA), trimethylsilane (TMS), and silazanes, such as hexamethylcyclotrisilazane (HM-CTZ). Examples of carbon-containing compounds that may be used include hydrocarbon compounds having the general formula $C_xH_y$, such as alkanes, alkenes, and alkynes. An example of a phosphorous-containing compound that may be used is phosphine ($PH_3$).

The boron-containing film may be deposited on the substrate in the chamber from the boron-containing precursor in the presence or absence of a plasma in the chamber.

For deposition of the boron-containing film in the absence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. A combination of boron-containing, nitrogen-containing, carbon-containing, oxygen-containing and silcon-containing compounds may be introduced in the chamber at the same time at a flow rate between about 5 sccm and about 50 slm, such as between 10 sccm and about 1 slm.

For deposition of the boron-containing film in the presence of a plasma in the chamber, the temperature of a substrate support in the chamber may be set to between about 100° C. and about 1000° C., e.g., between about 300° C. and about 500° C., and the pressure in the chamber may be between about 10 mTorr and about 760 Torr, e.g., between about 2 Torr and about 10 Torr, during the deposition. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

Returning to FIG. 4, after the boron-containing film is deposited, the boron-containing film is treated to modify its composition by incorporating nitrogen or oxygen into the film and form a boron nitride or boron oxide film. The boron nitride or boron oxide film may have a thickness of between about 2 Å and about 5000 Å. The treatment is selected from the group consisting of a plasma process, an ultraviolet (UV) cure process, a thermal anneal process, and combinations thereof, and comprises exposing the boron-containing film to a nitrogen-containing precursor to incorporate nitrogen into the film and form the boron nitride film. The nitrogen-containing precursor may be nitrogen gas ($N_2$), ammonia ($NH_3$), or hydrazine ($N_2H_4$), for example. The nitrogen-containing precursor may be diluted with a dilution gas such as argon, helium, hydrogen, or xenon. Exposing the boron-containing film to a oxygen-containing precursor allows incorporation of oxygen in the film and formation of a boron oxide film. The oxygen-containing precursor may be oxygen gas ($O_2$), nitrous oxide ($N_2O$) or carbon dioxide ($CO_2$).

In embodiments in which the treatment comprises a plasma process, the plasma process may be performed in the same chamber in which the boron-containing film was deposited or a different chamber. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W. The nitrogen-containing precursor may be introduced into the chamber at a flow rate of between about 5 sccm and about 50 slm, such as between about 100 sccm and about 500 sccm, during the treatment. The nitrogen-containing precursor may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment. Increased high frequency RF power, increased $NH_3$ flow rates, and longer treatment times of the plasma process can be used to adjust the etch rate of the films.

In embodiments in which the treatment comprises a UV cure process, the UV cure process may be performed in the same chamber as the deposition chamber or in a chamber which is part of an integrated tool that includes the deposition chamber in which the boron-containing fim was deposited. For example, the UV cure process may be performed in a NANOCURE™ chamber that is part of a PRODUCER® platform that includes a PECVD chamber in which the boron-containing film is deposited.

Exemplary UV cure process conditions that may be used include a chamber pressure of between about 10 mTorr and about 760 Torr and a substrate support temperature of between about 20° C. and about 1000° C. The nitrogen-containing precursor may be introduced into the chamber at a flow rate of between about 5 sccm and about 50 sccm during the treatment. The nitrogen-containing precursor may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The treatment may comprise exposing the boron-containing film to between about 1 Watt/cm$^2$ and about 1000 Watts/cm$^2$ of ultraviolet radiation, and the ultraviolet radiation may provide a photon energy between about 0.5 eV and about 10 eV, such as between about 1 eV and about 6 eV.

Typically, the UV cure process removes hydrogen from the film, which is desirable as hydrogen can diffuse through the film and into semiconducting regions of the substrate and degrade reliability of a device formed on the substrate. The UV cure process also typically increases the density of the film and reduces the etch rate.

In embodiments in which the treatment comprises a thermal process, the thermal process may be performed in the same chamber in which the boron-containing film was deposited or a different chamber. The nitrogen-containing precursor may be introduced into the chamber at a flow rate of between about 5 sccm and about 50 slm, such as between about 10 sccm and about 1 slm, during the treatment. The nitrogen-containing precursor may be flowed into the chamber for a period of time such as between about 1 second and about 10 hours, such as between 10 seconds and about 20 minutes. The chamber pressure may be between about 10 mTorr and about 760 Torr, and the temperature of a substrate support in the chamber may be between about 20° C. and about 1000° C. during the treatment.

While a substrate is exposed to the boron-containing precursor and the nitrogen-containing precursor sequentially in the embodiments described with respect to FIG. 4, in alternative embodiments, a substrate is exposed to the boron-containing precursor and the nitrogen-containing precursor (and/or an oxygen-containing) precursor simultaneously. Generally speaking, simultaneous exposure allows greater film growth rates and reduces the ability to control the thickness of thin films. In such embodiments, the boron-containing precursor and the nitrogen-containing or oxygen-containing precursor are introduced into a chamber and then reacted to chemically vapor deposit a boron nitride or boron oxide film on a substrate in the chamber. Optionally, a silicon-containing compound, a carbon-containing compound, a phosphorous-containing compound, or combination thereof may also be introduced into the chamber at the same time to deposit a doped boron nitride film. The reaction of the boron-containing precursor, the nitrogen-containing or oxygen-containing precursor, and the optional other compounds may be performed in the presence or absence of a plasma in the chamber.

The ensuing discussion discusses specific process conditions for growing boron nitride as an exemplary low etch rate material. The boron-containing precursor and the nitrogen-containing precursor may be any of the precursors described above with respect to the embodiments of FIG. 4. Similarly, the chamber and substrate may be any of the chambers and substrates, respectively, described above with respect to the embodiments of FIG. 4.

The boron-containing precursor may be introduced into the chamber with nitrogen ($N_2$), hydrogen ($H_2$), argon (Ar) or a combination thereof as a dilution gas. The boron-containing precursor may be introduced into the chamber at a flow rate between about 5 sccm and about 50 slm, such as between about 10 sccm and about 1 slm. The nitrogen-containing precursor may be introduced into the chamber at a flow rate between about 5 sccm and about 50 slm, such as between about 10 sccm and about 1 slm. The dilution gas may be introduced into the chamber at a flow rate between about 5 sccm and about 50 slm, such as between about 1 slm and about 10 slm.

In embodiments in which the boron-containing precursor and the nitrogen-containing precursor are reacted in the presence of a plasma, a chamber pressure of between about 10 mTorr and about 760 Torr, e.g., between about 2 Torr and about 10 Torr, and a substrate support temperature of between about 100° C. and about 1000° C., e.g., between about 300° C. and about 500° C., may be used during the deposition. The spacing between a showerhead of the chamber and the substrate support may be between about 100 mils and about 10000 mils. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, e.g., about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, e.g., 13.6 MHz. Alternatively, the RF power may be provided at a mixed frequency including a first frequency between about 100 kHz up to about 1 MHz, e.g., about 300 kHz to about 400 kHz at a power level between about 2 W and about 5000 W, such as between about 30 W and about 1000 W, and a second frequency of greater than about 1 MHz, such as greater than about 1 MHz up to about 60 MHz, e.g., 13.6 MHz, at a power level between about 2 W and about 5000 W, such as between about 30 W and about 1000 W.

Low dielectric etch rate materials other than boron nitride are also the subject of this patent as described earlier and set forth in the claims. In embodiments in which the boron-containing precursor and the nitrogen-containing, oxygen-containing, carbon-containing and/or silicon-containing precursor are reacted in the absence of a plasma, a chamber pressure of between about 10 mTorr and about 760 Torr and a substrate support temperature of between about 100° C. and about 1000° C. may be used during the deposition. The spacing between a showerhead of the chamber and the substrate support may be between about 50 mils and about 5000 mils.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" describes a gas wherein at least some of the gas molecules are in vibrationally-excited, dissociated and/or ionized states. A gas may be a combination of two or more gases. The term trench is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing dielectric material in a trench in a semiconductor substrate, the method comprising:
   forming a liner layer comprising a bilayer, wherein the bilayer comprises a silicon nitride layer and a boron nitride layer over bottom and sidewall surfaces of the trench;
   depositing the dielectric material comprising silicon oxide over the liner layer, wherein the dielectric material at least partially fills the trench; and
   etching a portion of the deposited dielectric material with an etchant, wherein the etchant removes the dielectric material at a higher etch rate than the liner layer.

2. The method of claim 1, wherein the liner layer is a trilayer comprising a boron nitride layer formed between a pair of silicon nitride layers.

3. The method of claim 1, wherein the step of etching a portion of the deposited dielectric material exposes a void formed in the dielectric material in the trench.

4. The method of claim 3, wherein the method further comprises depositing a second portion of the dielectric material in the trench, wherein the second portion of dielectric material at least partially fills the exposed void.

5. The method of claim 1, wherein the step of etching a portion of the deposited dielectric material widens a gap formed by the dielectric material in the trench.

6. The method of claim 1, wherein the step of etching a portion of the deposited dielectric material involves a dry etch comprising reactive fluorine.

7. The method of claim 1, wherein the step of etching a portion of the deposited dielectric material comprises dry etching the dielectric material in a process gas comprising $NH_3$ and $NF_3$.

8. The method of claim 1, wherein the etchant comprises a reactive fluorine species formed from nitrogen trifluoride ($NF_3$).

9. A method of removing a void formed in a dielectric material that fills a trench in a semiconductor substrate, the method comprising:
   etching a top portion of the dielectric material to expose an opening in the void, wherein the etching also exposes a portion of a liner layer comprising a bilayer, wherein the bilayer comprises a silicon nitride layer and a boron nitride layer that was covered by the dielectric material; and
   depositing additional dielectric material into the exposed void to remove the void by filling it with the additional dielectric material.

10. A method of depositing a film to fill a gap in a surface of a substrate, the method comprising:
    forming a dielectric liner on the surface of the substrate, wherein a silicon oxide to dielectric liner etch ratio is greater than about 50;
    depositing a first layer of dielectric on the dielectric liner;
    etching the surface of the substrate; and
    depositing a second layer of dielectric to substantially fill the gap.

11. The method of claim 10, wherein the oxide to dielectric liner etch ratio is greater than about 75.

12. The method of claim 10, wherein the oxide to dielectric liner etch ratio is greater than about 100.

13. The method of claim 10, wherein the dielectric liner comprises boron nitride.

14. The method of claim 10, wherein the dielectric liner has an atomic concentration of boron which is greater than 5%.

15. The method of claim 10, wherein the dielectric liner has an atomic concentration of carbon which is greater than 5%.

16. The method of claim 10, wherein the dielectric liner has an atomic concentration of boron which is greater than 10%.

17. The method of claim 10, wherein the dielectric liner has an atomic concentration of carbon which is greater than 10%.

18. The method of claim 10, wherein the dielectric liner has an atomic concentration of boron which is greater than 20%.

19. The method of claim 10, wherein the dielectric liner has an atomic concentration of carbon which is greater than 20%.

20. The method of claim 10, wherein the dielectric liner comprises a material selected from the group consisting of boron carbide, boron oxide, silicon carbide, boron nitride, boron carbon nitride, phosphorous boron nitride, carbon nitride, silicon boron nitride, boron silicon oxide and silicon carbon nitride.

21. The method of claim 10, further comprising a step of forming a layer of silicon nitride before forming the conformal layer of boron nitride.

22. The method of claim 10, further comprising a step of forming a layer of silicon nitride before depositing the first layer of dielectric.

23. The method of claim 10, further comprising a step of forming a first layer of silicon nitride before forming the conformal layer of boron nitride and a second layer of silicon nitride before depositing the first layer of dielectric.

24. The method of claim 10, wherein the step of etching the substrate comprises dry etching the substrate in a process gas comprising $NH_3$ and $NF_3$.

* * * * *